United States Patent [19]

Peterson et al.

[11] Patent Number: 5,315,603
[45] Date of Patent: May 24, 1994

[54] BACKSCATTER ABSORPTION FOR LASER DIODES

[75] Inventors: Phillip R. Peterson; Athanasios Gavrielides, both of Albuquerque, N. Mex.

[73] Assignee: The United States of America as represented by the Secretary of the Air Force, Washington, D.C.

[21] Appl. No.: 3,065

[22] Filed: Jan. 11, 1993

[51] Int. Cl.$^5$ ............................................. H01S 3/10
[52] U.S. Cl. ....................................... 372/21; 372/11; 372/19; 372/97; 372/29; 372/98
[58] Field of Search ............... 372/71, 21, 69, 97, 372/76, 19, 92, 98, 33, 3, 75, 11, 9, 29

[56] References Cited

U.S. PATENT DOCUMENTS

| | | | |
|---|---|---|---|
| 4,196,396 | 4/1980 | Smith | 330/4.3 |
| 4,236,785 | 12/1980 | Papuchon et al. | 350/96.14 |
| 4,382,660 | 5/1983 | Pratt, Jr. et al. | 350/353 |
| 4,431,263 | 2/1984 | Garito | 350/96.34 |
| 4,503,541 | 3/1985 | Weller et al. | 372/19 |
| 4,515,429 | 5/1985 | Smith et al. | 350/96.13 |
| 4,594,715 | 6/1986 | Knollenberg | 372/32 |
| 4,656,635 | 4/1987 | Baer et al. | 372/27 |
| 4,656,641 | 4/1987 | Scifres et al. | 372/103 |
| 4,868,833 | 9/1989 | Stultz et al. | 372/19 |
| 4,884,276 | 11/1989 | Dixon et al. | 372/75 |
| 4,928,282 | 5/1990 | Barthelemy et al. | 372/21 |
| 4,997,243 | 3/1991 | Aiki et al. | 350/96.2 |
| 5,028,770 | 7/1991 | Miyazaki et al. | 235/462 |
| 5,079,772 | 1/1992 | Negus et al. | 372/18 |
| 5,103,486 | 4/1992 | Grippi | 382/4 |
| 5,166,942 | 11/1992 | Cardimona et al. | 372/21 |

Primary Examiner—Léon Scott, Jr.
Attorney, Agent, or Firm—Donald J. Singer; William G. Auton

[57] ABSTRACT

Whenever any laser is interfaced with any type of optics there is always backscatter back into the laser. For diode lasers this backscatter makes it emit chaotic radiation where the frequency spectrum is broad and contains many different frequencies. This means that the laser has limited use as a source of information transfer in fibers. This weakness can be overcome, by driving the laser with an external cavity filled with a Kerr material. The addition of a Kerr material in the external cavity suppresses the chaos, or coherence collapse. Thus the new apparatus of laser plus external cavity filled with a Kerr material increases the stability of the diode laser.

4 Claims, 3 Drawing Sheets

BACKSCATTER ABSORPTION FOR LASER DIODES

STATEMENT OF GOVERNMENT INTEREST

The invention described herein may be manufactured and used by or for the Government for governmental purposes without the payment of any royalty thereon.

BACKGROUND OF THE INVENTION

The present invention relates generally to lasers, and more specifically the invention pertains to a system and a process for suppressing chaos in diode lasers due to optical backscatter from optical elements. Whenever any laser is interfaced with any type of optics there is always backscatter back into the laser. For diode lasers this backscatter makes it emit chaotic radiation where the frequency spectrum is broad and contains many different frequencies. This means that the laser has limited use as a source of information transfer in fibers.

The task of suppressing chaos in diode lasers due to optical backscatter is alleviated, to some extent, by the system disclosed in the following U.S. Patents, the disclosures of which are incorporated herein by reference.

U.S. Pat. No. 4,515,429 issued to Smith et al;
U.S. Pat. No. 4,196,396 issued to Smith;
U.S. Pat. No. 4,236,785 issued to Papuchon et al.;
U.S. Pat. No. 4,382,660 issued to Pratt, Jr. et al.;
U.S. Pat. No. 4,431,263 issued to Garito;
U.S. Pat. No. 5,103,486 issued to Grippi;
U.S. Pat. No. 5,028,770 issued to Miyazaki et al.
U.S. Pat. No. 4,997,243 issued to Aiki et al.;
U.S. Pat. No. 4,884,276 issued to Dixon et al.;
U.S. Pat. No. 4,656,641 issued to Scifres et al.
U.S. Pat. No. 4,656,635 issued to Baer et al.; and
U.S. Pat. No. 4,594,715 issued to Knollenberg.

All of the above references deal with diode laser technology. The Smith et al. reference uses a Kerr medium in an interferometer cavity. While these references are instructive, a need remains to suppress the chaos in diode lasers due to optical backscatter from ordinary optical elements. The present invention is intended to satisfy that need.

SUMMARY OF THE INVENTION

The present invention includes a method and apparatus in which the intensity spectrum of a diode laser coupled to an external cavity can be stabilized. One embodiment of the invention includes a laser diode coupled to an external single-delay, 2 nanosecond, Kerr cavity. It is shown that over a large range of feedback levels, for various Kerr constants, the steady state power dependent spectrum consists of one frequency which is shifted about .03 Ghz from the solitary laser frequency. This is manifested by suppressing mode hopping at moderate feedback levels corresponding to level II. Similarly, coherence collapse is suppressed and its onset is shifted to higher feedback levels.

In its most basic form, the apparatus of the present invention is a diode laser which is coupled to an external cavity in which a nonlinear Kerr material has been inserted. This external cavity is used to drive the diode laser while suppressing the chaos induced by optical backscatter.

When described as a method, the present invention may be described as a process of driving a diode laser which begins with the step of coupling the diode laser with an external cavity containing nonlinear Kerr material, and then activating the external cavity to drive the diode laser. The crux of the invention is the use of a nonlinear Kerr material in the external cavity. Since this medium is intensity dependent the laser controls the external cavity losses and hence the spectra. This is the physical mechanism for suppression of the coherence collapse. Nonlinear Kerr materials include carbon disulfide, nitrobenzene and polydiacetylene. The Kerr medium should substantially fill the external cavity.

The object of this invention is to suppress chaos in diode lasers due to optical backscatter from ordinary optical elements. For example, suppose the laser beam leaves the laser and travels through some lenses to be focussed. In this process some of the beam backscatters back into the laser diode. Over a large range of reflectivities of the optics this backscatter makes the laser run chaotically. That is, this combination produces many frequencies. Thus the laser cannot, for example, be used in any type of communications. We show that the addition of a Kerr material in the external cavity suppresses the chaos, or coherence collapse. Thus the new apparatus of laser plus external cavity filled with a Kerr material increases the stability of the diode laser.

These objects together with other objects, features and advantages of the invention will become more readily apparent from the following detailed description when taken in conjunction with the accompanying drawings wherein like elements are given like reference numerals throughout.

DESCRIPTION OF THE DRAWINGS

FIG. 4 is for the empty cavity;

FIG. 5 is for the Kerr cavity and FIG. 6 is for the empty cavity.

DETAILED DESCRIPTION OF THE PREFERRED EMBODIMENT

The present invention includes a method and apparatus in which the intensity spectrum of a diode laser coupled to an external cavity can be stabilized.

When described as a method, the present invention is a process of driving a diode laser which begins with the step of coupling the diode laser with an external cavity containing nonlinear Kerr material, and then activating the external cavity to drive the diode laser. The crux of the invention is the use of a nonlinear Kerr material in the external cavity. Since this medium is intensity dependent the laser controls the external cavity losses and hence the spectra. This is the physical mechanism for suppression of the coherence collapse. Nonlinear Kerr materials include carbon disulfide, nitrobenzene and polydiacetylene. The Kerr medium should substantially fill the external cavity, since without it under very general feedback conditions the external cavity can drive the laser into coherence collapse where the output frequency spectrum is very wide.

This invention will suppress this chaos and thus make the laser much more useful. This is done by inserting a nonlinear Kerr material in the external cavity. In this situation the laser really controls the losses and hence the laser spectrum.

Figure 1:
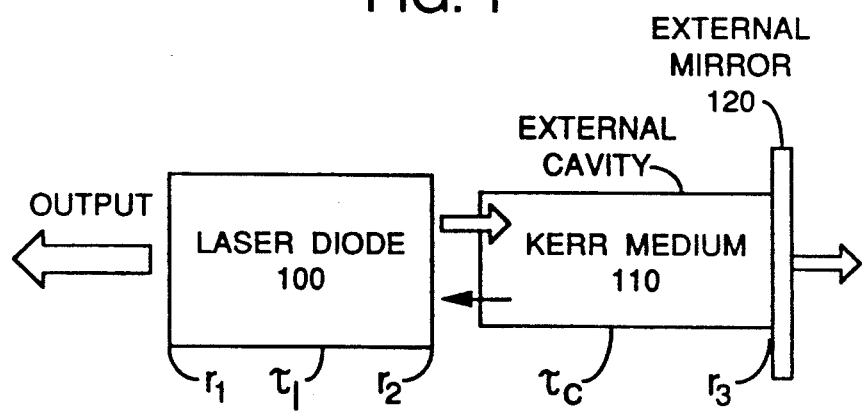
FIG. 1 is a schematic of a Laser diode coupled to an external cavity filled with a nonlinear Kerr material in which the output is taken from the mirror $r_1$.

The reader's attention is now directed towards FIG. 1, which is an illustration of a laser diode coupled to a single delay external nonlinear Kerr cavity. As mentioned in the above-cited Smith et al. reference, a Kerr medium is a medium in which the index of refraction is a function of optical intensity within the medium. Laser diodes are well known and described in detail in such texts as "Semiconductor Lasers and Heterojunction LEDs" by Henry Kressel, the disclosure of which is incorporated herein by reference. Because each of these components have been studied individually, we will move directly to the coupling aspect. The general form of the delay problem is characterized by the laser diode equations supplemented by a logarithmic loss term consisting of an infinite sum of forward and backward delayed external cavity fields. In our case, the external cavity is filled with a Kerr medium whose the nonlinear index-of-refraction is described with the Debye equation. Rather than study the general problem, we develop the weak coupling single transit delay-differential equations.

The following represent our initial investigation into coupling between a laser diode and an external single-delay Kerr cavity. We do not attempt an in-depth study including such questions as current modulation, short cavity mode selection, stability, chirp, etc. Rather, we restrict the following to a comparison of simulations between an empty cavity and an identical Kerr cavity for the five feedback regions. At this point in the development we are assessing the conditions and possible Kerr materials for effective coupling.

In order to quantify this brief introduction we move to the laser diode equations supplemented with the loss term and the Debye equation for the nonlinear Kerr phase. Because the Kerr medium effects only the phase, our development parallels the empty cavity derivation with the nonlinear phase $\phi_{nl}$ added to the linear external cavity phase. Thus, we will not belabor the derivation. Specifically, the working differential equations are obtained by making the standard substitutions for the electric field, $E(t)=A(t)\exp(i(\Phi(t)+i\omega t))$; the carrier density, $N(t) = \overline{N}(t)+n(t)$; the gain, $G=gN=\overline{G}+gn$; and the pulled frequency $\omega(N)=\omega+\beta$ in which $\beta=$antiguiding factor *g/2. Note that the barred quantities represent the solitary laser threshold conditions. After some algebra we obtain $$A=\tfrac{1}{2}(G+gn-1/\tau_p)A+\kappa A(t-\tau_c)\cos(\Psi) \qquad (1a)$$

$$\phi=\beta n+\kappa(A(t-\tau_c)/A(t))\sin(\Psi) \qquad (1b)$$

and $$n=\overline{R}=(\overline{G}+gn)A^2-n\tau_s \qquad (1c)$$

where $1\tau_p|ln(r_1r_2)|/\tau_l$ and $\kappa=(t^2 2r_e/r_2)\tau_l$ with $\tau_l=c/2L_b$ and $\tau_c$ is the external cavity round trip time. Here $r_1$ and $r_2$ are the laser facet reflectivities with $r_2$ coupling into the external cavity, and $r_3$ is the reflectivity of the external cavity output mirror. The phase angle $\Psi=\phi(t-\tau_c)-\phi(t)-\phi_{nl}(t-\tau_c)-2\overline{\omega}t)$ and it contains the current plus delayed laser phase coupled with the nonlinear phase. In Eq. (1), $A^2$ is the density of cavity photons and is related to the electric field E by $|A|^2=\tfrac{1}{2}\sqrt{\epsilon_0/\mu_0}|E|^2/ch\nu$ where c is the speed of light, h is Planck's constant and $\nu$ is the frequency. Accompanying the above is the Debye equation for the nonlinear Phase $$\dot{\phi}_{nl}+\Gamma\phi_{nl} = 3\Gamma\omega\tau_c n_2 t_2^{'2} \{|E(t) + r_2 r_3 E(t-\tau_c)\exp(i(\theta(t-\tau_c))|^2 + r_3^2|E(t-\tau_c)|^2\} \qquad (2)$$

since the rapidly oscillating cross-terms between the forward and backward waves do not appear. In this equation $n_2$ is the Kerr nonlinear constant, is the decay rate, and $t^2{}_2=1-r_2{}^2$.

Also $\theta$ is the sum of the external cavity linear phase $\omega t$ and the nonlinear phase $\phi_{nl}$. Note that in this approximation we are retaining terms up to the product $r_i r_j$ where i,j=2,3. The first absolute value term on the right-hand-side of Eq. (2) is the contribution from the forward cavity field after one round trip and the second absolute value term is due to the backward going field. This concludes our brief development of weak coupling and we close by noting that the cross-term in the forward wave contribution contains a coupling between the laser field phase and the nonlinear phase.

In the following simulation we assume the solitary laser has a steady state output power $P_O$ of 4mW, a decay time of $\tau_s=3\times10^{-9}$sec, and a relaxation oscillation frequency $\omega_r/2\pi=2.5$GHz. Additionally, the facet reflectivities are $r^2{}_1=r^2{}_2=32\%$. From this information we initialize the integrator using the solitary laser steady state conditions. The 4mW condition determines the initial value of the amplitude $A_O$, at $t=0$, as $A^2O=-P_O/ch\nu$ /(area) where the laser area $A_l=0.2\times10^{-12}$ meters$^2$. Next we set $\overline{G}=1/\tau_p$ Consequently, with $n=0$, the pumping $\overline{R}=GA^2{}_0$. The gain g is found $g=\omega^2{}_rR$ and we set $\beta=3g$. This procedure anchors our code to experiment and insures that the integrator will respond with a lasing solution. In a moment, we will estimate the order of magnitude of the nonlinear Kerr constant and then present several examples for a cavity with a round trip time of two nanoseconds. Finally, the numerical simulation is driven by a fourth order Runge-Kutta with a step size of $2^{19}$ points spanning the time integration.

In this investigation the difference between an empty cavity and a Kerr cavity throughout the five feedback regimes is presented. To do this comparison we first simulate the bare cavity which is anchored to previous results. Then we run the same computer program with the inclusion of the Debye equation. Before examining our results we briefly consider the steady-state equations and their impact on the dynamics.

The steady state conditions are obtained from Eqs. (1,2) by setting the time derivatives equal to zero and making the substitution $\delta=\overline{\omega}-\omega$. Further, we assume that the carrier density $n(\omega,A)$ can be approximated by $n(\overline{\omega},A)$ since $\delta/\omega\neq10^{-7}$. Additionally we assume that $r_3$ is very small so that $\phi_{nl}$ is proportional to $E_2$ and in doing so we neglect the sinusoidal steady state dependence in Eq. (2). These conditions give the coupled steady state equations $$0=gn(\overline{\omega},P)+2\kappa\cos(\overline{\omega}\eta P+\tau_c\delta+\Delta)), \qquad (3a)$$

$$0=\delta+\beta n(\overline{\omega},P)+\kappa\sin(\overline{\omega}\eta P+\tau_c\delta+\Delta)). \qquad (3b)$$

The steady state carrier density is given by $$n(\omega,P)=(\overline{R}-\overline{G}\chi P)/(g\chi P+1/\gamma_s), \quad (3c)$$

with $$\eta = 3n_2\tau_d 2^2/(.5\sqrt{\epsilon/\mu}\ A_1), \text{ and } \chi = 2\pi/(\omega\ ch\ A_1).$$

Furthermore, the bare external cavity frequency condition is obtained by setting $\eta=0$ and subtracting Eqs. (3a, 3b), thus $$0=\delta+\kappa \sin(\gamma_c\delta+\Delta)-2\beta\kappa/g\ \cos(\gamma_c\delta+\Delta). \quad (3d)$$

In these equations $\Delta$ is the detuning from empty cavity resonance.

It is at this point that $n_2$ can be estimated. The nonlinear phase is important when it is at least equal to the linear cavity pulling. That is, when $\overline{\omega}\eta P$ equals $\tau_c\delta$ or $n_2 P_0 \sqrt{\epsilon/\mu}(\delta/\omega)/3t^2 2$. Using the above specifications, this condition gives $n_2 \geq 1\times 10^{-20}$( for a shift $\delta$ equal to a fraction of the round trip frequency. This then eliminates fibers as candidates and leaves $CS_2$ at $n_2 \cong 10^{-20}$ (m/V)$^2$ or various materials such as PTS[6] with $n_2 \cong 10^{-18}$(m/V)$^2$. In the following example we use the latter.

Figure 2:
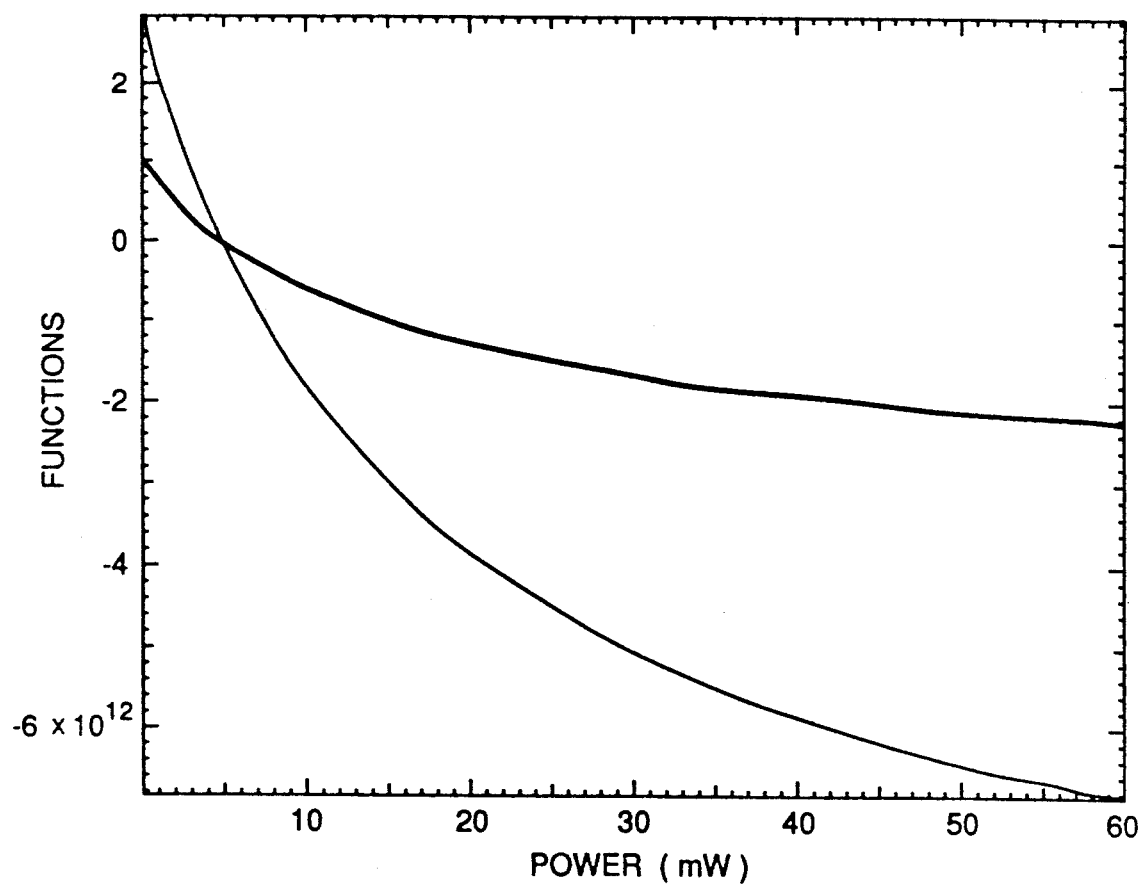
FIG. 2 is a chart of steady state equations as a function of power P(mW) for $k=0.6\times10^9$/sec where the upper curve is Eq. (3a), the lower Eq. (3b) and the root is at P $=5.88$mW and $\delta/2\pi=0.072$Ghz.
Figure 3:
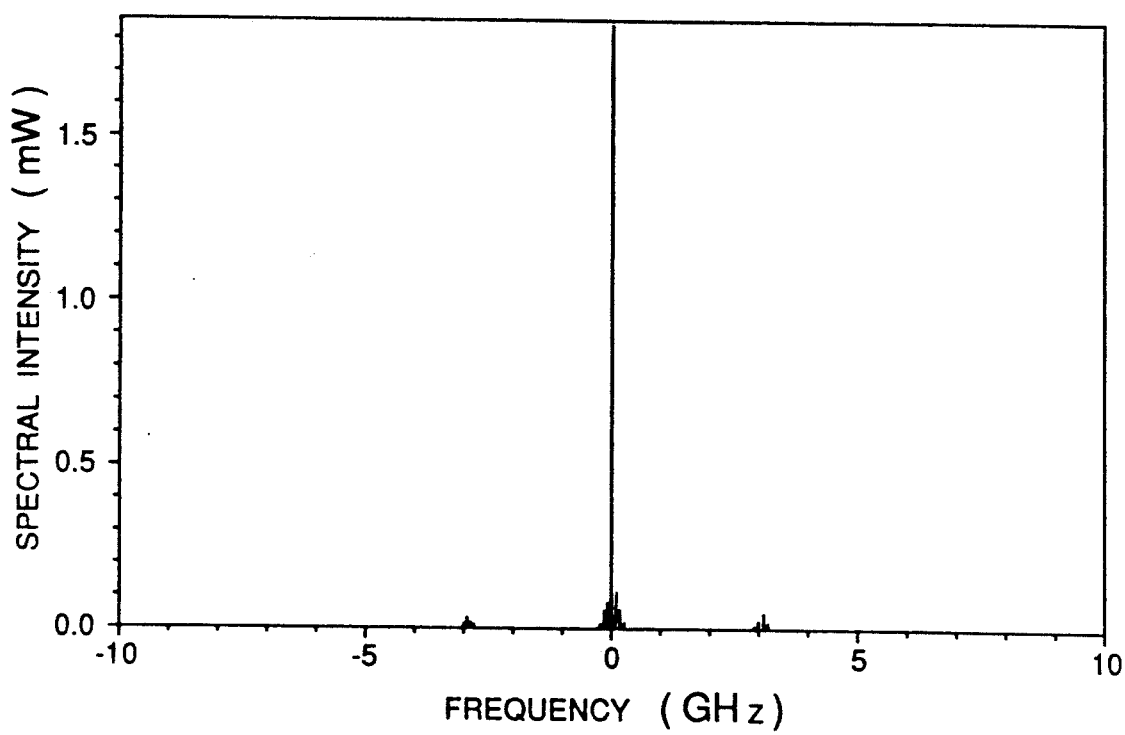
FIG. 3 and 4 are charts of the spectral intensities in mW as a function of the frequency shifts for $k=0.6\times10^9$/sec. FIG. (3) is for the Kerr cavity

The important feature to note about Eq. (3d) is the absence of the carrier density. However, in the nonlinear case $n(\overline{\omega},P)$ governs the nonlinear cavity power dependent frequency spectrum. This represents gain clamping. To be more specific over a large range of feedback levels, which covers regimes I, II, III, and well into region IV, the nonlinear equations allow only one simultaneous root while the number of bare cavity roots varies from one to five. We illustrate the nonlinear solution in FIGS. 2A and 3. Not only do the number of roots change but their values, according to the solution of Eq. (3a,3b), are also considerably different. The empty cavity frequency shifts are, for our example, about 0.3GHz, slightly less than the cavity round trip time. In the Kerr case there is only one frequency root and its absolute value is about a factor of ten less, 0.03GHz, with an associated power near the steady state solitary laser power. Thus the frequency shift is considerably smaller. We believe that it is the single root and its small shift which contributes to suppressing coherence collapse at larger feedback levels. This will be illustrated in a moment.

In passing we mention that Eqs. (3a–c) show that the shift is mildly power dependent. In other words, as shown above, if the steady state output laser power $P_0$ changes due to a change in pumping then $\overline{R}$ changes accordingly. Thus the solutions to Eqs. (3) change Eq. (3d) even for fixed feedback k. It is in this sense that the spectral shifts and linewidth are pump dependent. We will not present any detailed numerical results since they are strongly dependent on the specific parameters. However, for $k=0.6\times 10^9$/sec $\delta/2\pi$ ranges from $-0.03$GHz to $+0.17$GHz for $P_0=0.4$ mW to 40 mW. Additionally, both the linear and the nonlinear cavity show the same sensitivity to changes in $\Delta$.

The single root gain clamping results from the laser adjusting the external cavity length so that the gain balances the losses see Eqs. (3a, 3b). This adjustment is done through the power and shift dependence of the optical path length expressed by $\overline{\omega}\eta P+\delta\tau_c+\Delta$. Thus with an external Kerr cavity the laser actively controls the external cavity losses, unlike the bare cavity configuration, and tries to run single mode.

One immediate impact of the spectral gain clamping is in region II and III. For the bare cavity configuration the steady state equations have two or more roots to Eq. (3d) and the dynamic behavior can exhibit mode hopping in region II. However, as seen from above, the Kerr cavity has only one root at these feedback levels and thus the mode hopping should be suppressed. Consequently, the range of useful feedback levels is increased.

Next we turn to the dynamic behavior and study the spectral intensities in region III, and in the coherence collapse regime, region IV. We find that the Kerr cavity intensity spectrum is always cleaner than the empty cavity spectrum. In fact, coherence collapse in the Kerr case can be suppressed for a large range of feedback levels. This depends, of course, on the magnitude of the nonlinear Kerr constant. Thus the region of stable operation is extended beyond the mode hopping region. In the following we simulate Eqs. (1,2) for both the empty cavity and an identical Kerr cavity filled with a material with $n_2=10^{-18}$(m/V)$^2$ and a decay time of $10^{-12}$ sec. Additionally, the spectral intensities shown in FIGS. 2-5 exit from a laser facet and not from the end of the Kerr cavity.

Figure 4:
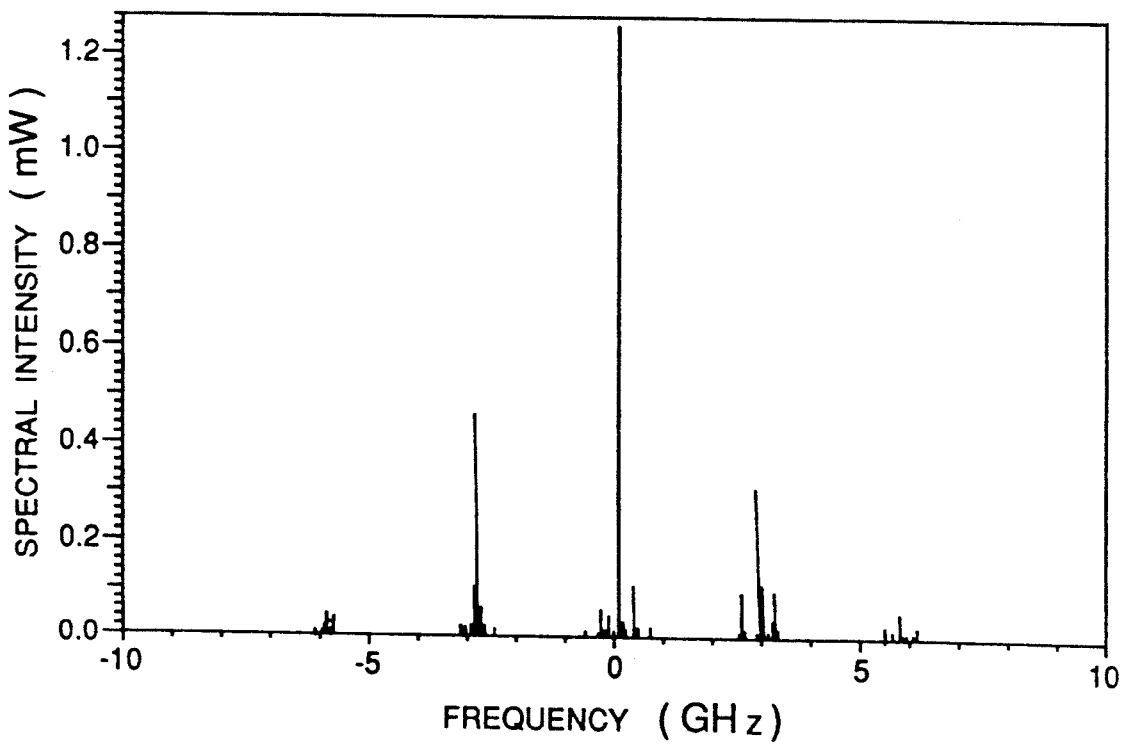
Figure 5:
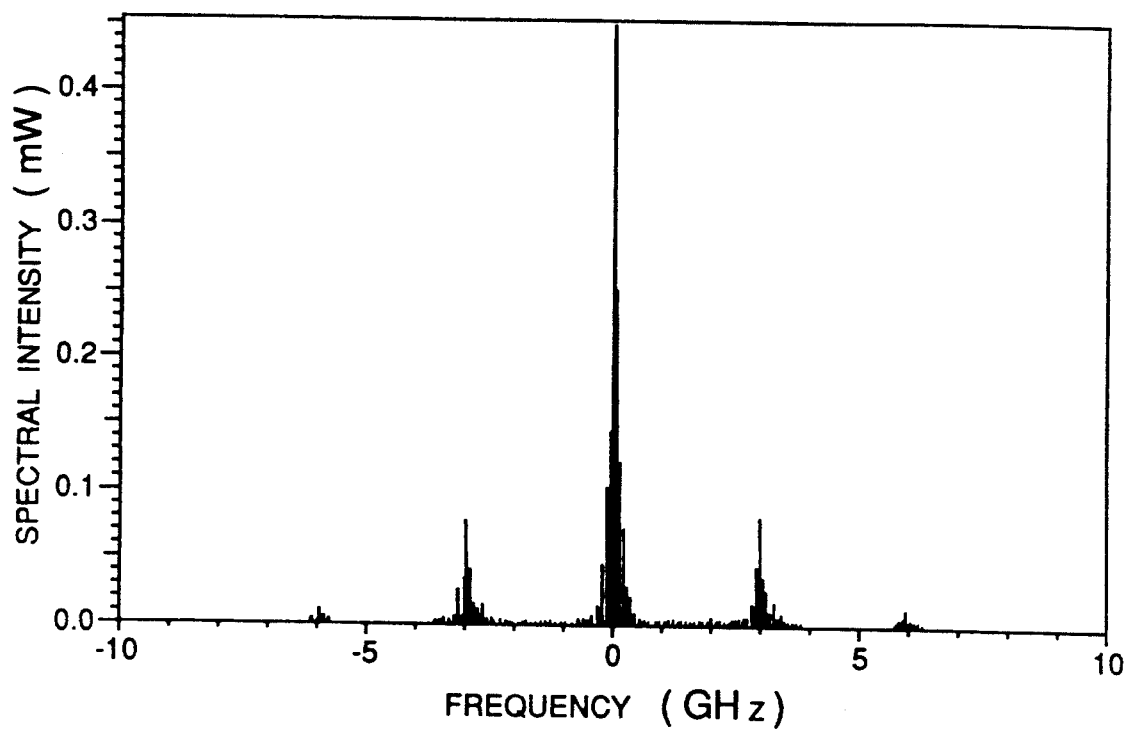
FIGS. 5 and 6 are charts of the spectral intensities in mW as a function of the frequency shifts for $k=0.2\times10^{10}$/sec.
Figure 6:
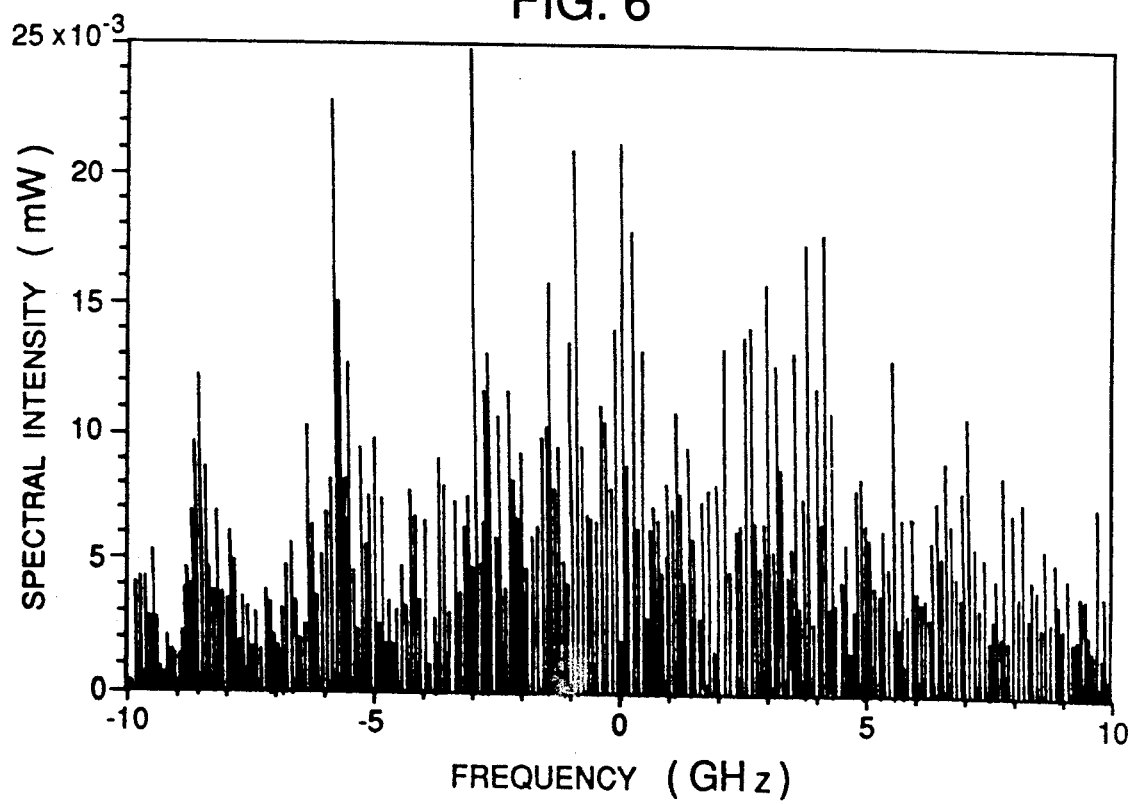

FIGS. 4 and 5 show the spectral intensities for the Kerr cavity, and the empty cavity in region III for $k=0.6\times 10^9$/sec. This coupling is just prior to the empty cavity coherence collapse at $k-0.7\times 10^9$/sec. In the Kerr cavity case, FIG. (2a), the central frequency remains at the solitary laser frequency and the side modes are constrained to 0.05Ghz. Additionally, the relaxation oscillations are suppressed. None of these features are present in the empty cavity simulation which is characterized by a pulling of the central frequency, side modes at about 0.3 Ghz, and strong relaxation oscillations, see FIG. 5.

Next we move into the coherence collapse region for $k=0.25\times 10^{10}$/sec. This value is chose since the bare cavity is well into coherence collapse, see FIG. (3b). The Kerr cavity in FIG. 1 a narrower central bandwidth of about 0.1 Ghz surrounding, again, the solitary unshifted laser frequency. Thus, for this example, coherence collapse is suppressed and if k is converted into the reflectivity then $r_3$ increases by about a factor of 12; since the empty cavity simulations indicate coherence collapse occurs for $k\cong 0.7\times 10^9$/sec.

In the above four cases the intensity as a function of time is complicated but one can easily discern the relaxation oscillations bound by a changing envelope. Also, we have simulated a slower medium by setting $1/\Gamma=100$ nanosecond and then repeating the above. For $k=0.6\times 10^9$/sec the spectral intensity looks like FIG. 4 except that the relaxation oscillations are suppressed and the central frequency band is shifted and broadened to about 0.1 Ghz. For the $k=0.15\times 10^9$/sec the Kerr cavity spectral intensity for a slow medium displays coherence collapse. In fact, it resembles FIG. (6) the bare cavity results. Coherence collapse in the empty cavity is demonstrable. However, in the Kerr cavity it is not because coherence collapse depends on $n_2$ and $\Gamma$.

Our simulations show for the fast medium, $\Gamma=10^{12}$, the Kerr cavity spectral intensity tends to remain like FIG. (5) as k increases. That is the relaxation oscillation and its harmonics are dominant and broadened, and the intervening spectrum grows slightly. The broad spectrum characteristics of coherence collapse are not evident.

The present invention uses one specific parameter space of a laser diode coupled to an external single-delay Kerr cavity. This coupling has been restricted to feedbacks commensurate with four of the typical five feedback levels. We have shown that due to the power dependence of the nonlinear phase the laser plus external cavity must be considered as a single system. This feature is exhibited in the steady state equations which require the simultaneous solution of the gain equal loss condition and the round trip phase replication condition. These result in a power dependent frequency shift spectrum. Four our coupling, in steady state, there is only one frequency shift which is about a factor of ten less than the typical empty cavity shifts. These features are dramatically different from the empty cavity feedback problem exemplified by a free running spectrum not connected to the laser gain characteristics. Dynamically, we find that the addition of the Kerr medium suppresses the region II mode hopping and suppresses coherence collapse at these feedback levels.

While the invention has been described in its presently preferred embodiment it is understood that the words which have been used are words of description rather than words of limitation and that changes within the purview of the appended claims may be made without departing from the scope and spirit of the invention in its broader aspects.

We claim:

1. A laser system comprising:
a laser which emits a coherent emission when driven with a driving signal, wherein said laser comprises a laser diode; and
a means for driving said laser with said driving signal, said driving means being coupled with said laser to supply said driving signal along with backscattered light thereto, said driving means being filled with a medium material which absorbs said backscattered light, wherein said driving means comprises an external laser cavity containing nonlinear Kerr material which absorbs said backscattered light, wherein said medium material consists of polydiacetylene.

2. A laser system comprising:
a laser which emits a coherent emission when driven with a driving signal, wherein said laser comprises a laser diode; and
a means for driving said laser with said driving signal, said driving means being coupled with said laser to supply said driving signal along with backscattered light thereto, said driving means being filled with a medium material which absorbs said backscattered light, wherein said driving means comprises an external laser cavity containing nonlinear Kerr material which absorbs said backscattered light, wherein said medium material consists of nitrobenzene.

3. A process for suppressing chaos produced by backscattered light in a laser, said process comprising the steps of:
coupling the laser with an external cavity which is filled with a medium material which absorbs backscattered light, wherein said medium material used in said coupling step is a nonlinear Kerr material consisting of polydiacetylene; and
driving the laser with the external cavity.

4. A process for suppressing chaos produced by backscattered light in a laser, said process comprising the steps of:
coupling the laser with an external cavity which is filled with a medium material which absorbs backscattered light, wherein said medium material used in said coupling step is a nonlinear Kerr material consisting of nitrobenzene; and
driving the laser with the external cavity.

* * * * *

UNITED STATES PATENT AND TRADEMARK OFFICE
CERTIFICATE OF CORRECTION

PATENT NO. : 5,315,603

DATED : 24 May 1994

INVENTOR(S) : Phillip R. Peterson, et al

It is certified that error appears in the above-identified patent and that said Letters Patent is hereby corrected as shown below:

On title page, item [54] the list of inventors should include:

— Paul M. Sharma of Albuquerque, N.M. —

Signed and Sealed this

Twentieth Day of December, 1994

Attest:

BRUCE LEHMAN

Attesting Officer     Commissioner of Patents and Trademarks